United States Patent
Dai et al.

(10) Patent No.: US 9,955,091 B1
(45) Date of Patent: Apr. 24, 2018

(54) HIGH DYNAMIC RANGE IMAGE SENSOR READ OUT ARCHITECTURE USING IN-FRAME MULTI-BIT EXPOSURE CONTROL

(71) Applicant: OMNIVISION TECHNOLOGIES, INC., Santa Clara, CA (US)

(72) Inventors: Tiejun Dai, Santa Clara, CA (US); Rui Wang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/384,859

(22) Filed: Dec. 20, 2016

(51) Int. Cl.
*H04N 5/355* (2011.01)
*H01L 27/146* (2006.01)
*H04N 5/378* (2011.01)

(52) U.S. Cl.
CPC ..... *H04N 5/3559* (2013.01); *H01L 27/14612* (2013.01); *H01L 27/14638* (2013.01); *H01L 27/14643* (2013.01); *H04N 5/378* (2013.01)

(58) Field of Classification Search
CPC ............ H04N 5/3559; H04N 5/378; H01L 27/14612; H01L 27/14638; H01L 27/14643
See application file for complete search history.

(56) References Cited

U.S. PATENT DOCUMENTS

| | | |
|---|---|---|
| 6,920,078 B2 | 7/2005 | Cho |
| 6,999,374 B2 | 2/2006 | Cho |
| 7,190,397 B2 | 3/2007 | Andersson |
| 8,072,518 B2 | 12/2011 | Araki et al. |
| 8,093,541 B2 | 1/2012 | Chen |
| 8,742,311 B2 | 6/2014 | Manabe |
| 8,896,743 B2 | 11/2014 | Du et al. |
| 9,118,851 B2 | 8/2015 | Dai et al. |
| 2006/0023109 A1* | 2/2006 | Mabuchi ............ H01L 24/17 348/340 |
| 2008/0239111 A1 | 10/2008 | Jiang |
| 2008/0284888 A1* | 11/2008 | Kobayashi ........... H04N 5/374 348/308 |
| 2009/0256060 A1 | 10/2009 | Meynants et al. |

(Continued)

OTHER PUBLICATIONS

U.S. Appl. No. 15/384,866, filed Dec. 20, 2016, Wang et al.
U.S. Appl. No. 15/384,872, filed Dec. 20, 2016, Wang et al.

*Primary Examiner* — Nicholas G Giles
(74) *Attorney, Agent, or Firm* — Christensen O'Connor Johnson Kindness PLLC

(57) ABSTRACT

A pixel circuit includes a photodiode to accumulate image charge in response to incident light. A transfer transistor is disposed between the photodiode and a floating diffusion disposed in the first semiconductor layer to selectively transfer the image charge accumulated in the photodiode to the floating diffusion. A select circuit is disposed in second semiconductor layer coupled to a control terminal of the transfer transistor through a hybrid bond between the first and second semiconductor layers to select between first and second transfer control signals to control the transfer transistor. The select circuit is coupled to output the first transfer control signal in response to a precharge enable signal during a read out operation of a different row, and output the second transfer control signal in response to a sample enable signal during a read out operation of the row.

19 Claims, 5 Drawing Sheets

(56) References Cited

U.S. PATENT DOCUMENTS

| | | | |
|---|---|---|---|
| 2010/0245647 A1* | 9/2010 | Honda | H01L 27/14634 348/308 |
| 2010/0276572 A1* | 11/2010 | Iwabuchi | H01L 27/14625 250/208.1 |
| 2012/0057056 A1* | 3/2012 | Oike | H01L 27/14634 348/294 |
| 2012/0307030 A1* | 12/2012 | Blanquart | H01L 27/14601 348/76 |
| 2014/0103411 A1* | 4/2014 | Dai | H01L 27/14609 257/292 |
| 2014/0252208 A1 | 9/2014 | Fujinaka et al. | |
| 2015/0237274 A1 | 8/2015 | Yang et al. | |

* cited by examiner

HIGH DYNAMIC RANGE IMAGE SENSOR READ OUT ARCHITECTURE USING IN-FRAME MULTI-BIT EXPOSURE CONTROL

BACKGROUND INFORMATION

Field of the Disclosure

The present invention is generally related to image sensors, and more specifically, the present invention is directed to high dynamic range image sensors.

Background

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

The demands on the image sensor to perform over a large range of lighting conditions, varying from low light conditions to bright light conditions are becoming more difficult to achieve as pixel circuits become smaller. This performance capability is generally referred to as having high dynamic range imaging (HDRI or alternatively just HDR). High dynamic range imaging is a very desirable feature for a number of applications such as for example automotive and machine vision. In conventional image capture devices, pixel circuits require multiple successive exposures such that the image sensor is exposed to both low and high light levels to achieve HDR. Traditional complementary metal oxide semiconductor (CMOS) image sensors suffer from low dynamic range due to limited well-capacity and fixed exposure times.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
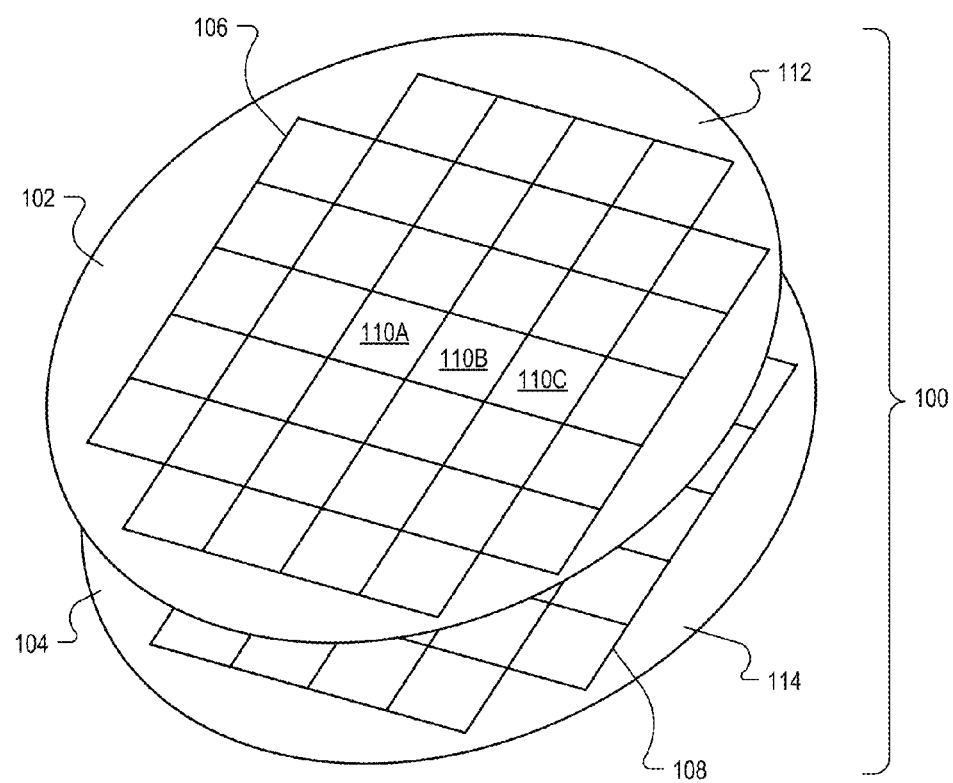
FIG. 1 is an exploded view of one example of stacked semiconductor device wafers with integrated circuit dies of an example imaging system with a high dynamic range image sensor read out architecture using in-frame multi-bit exposure control in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, examples in accordance with the teaching of the present invention describe an image sensor pixel circuit for use in a high dynamic range (HDR) image sensor, including control circuitry for controlling exposure and reading out HDR image data from each pixel circuit. As will be shown, a highly-programmable and high-efficiency exposure control and read out architecture is provided that improves the dynamic range performance with pixel hybrid bond technology. In various examples, the pixel arrays are disposed in a separate wafer from peripheral circuits, and two wafers are bonded together with pixel level bonding. There is a memory to store the exposure information for each pixel circuit, or each block of pixel circuits, right underneath the pixel circuits or blocks of pixel circuits. In various examples, in-frame programmable exposure control of each individual pixel circuit across the pixel array is provided with multi-bit resolution, which achieves optimal operation of each pixel circuit across the pixel array. Compared to known HDR imaging solutions, examples in accordance with the teachings of the present invention can achieve individual in-frame exposure control for each individual pixel circuit, which lead to improved charge integration across the pixel array. Such exposure control and read out techniques in accordance with the teaching of the present invention eliminate the need for multi-frame combinations or down-sampling of pixel circuit rows during read out, which lead to high frame rate and high spatial resolution in accordance with the teachings of the present invention.

To illustrate, FIG. 1 is an exploded view of one example of stacked semiconductor device wafers 102 and 104 with integrated circuit dies of an example single image sensing system 100 in accordance with the teachings of the present invention. In various examples, semiconductor device wafers 102 and 104 may include silicon, or other suitable semiconductor materials. In the illustrated example, device wafer 102 is a top sensor chip that includes a pixel array 106 having a pixel circuits 110A, 110B, 110C, etc., disposed in a first semiconductor layer 112. Device wafer 102 is stacked with device wafer 104, which includes corresponding support circuitry 108 disposed in a second semiconductor layer 114 and coupled to pixel array 106 through pixel level hybrid bonds to support operation of the photon detection array 106 in accordance with the teachings of the present invention.

As will be discussed in more detail below, in some examples, the pixel circuits 110 in first semiconductor layer 112 include photodiodes that are coupled to floating diffusions through transfer transistors, the corresponding support circuits 108 included in the second semiconductor layer 114 include select circuits that are coupled to output first transfer control signals coupled to transfer transistors in response to precharge enable signals during read out operations of different rows that do not include transfer transistors, while the selection circuits are coupled to output second transfer control signals in response to a sample enable signals to transfer transistors during read out operations of the same rows that include the transfer transistors in accordance with the teachings of the present invention. In the various examples, the select circuits included in support circuits 108 may include an exposure memory so that each individual pixel may have a multi-bit (e.g., 4-bits) exposure value stored in it. This exposure memory may be interconnected through the pixel level hybrid bonds to the pixel circuits disposed in the first semiconductor layer. The exposure memory may be implemented a static random access memory, or other suitable type of memory. In addition, in various examples, the exposure memory may also be shared among a block of pixel circuits, such as for example of block of 8×8 pixel circuits.

It is noted that the example image sensing system 100 shown in FIG. 1 is illustrated with two stacked semiconductor device wafers 102 and 104 for explanation purposes. In other examples, it is appreciated that the image sensing system 100 may include more than two stacked semiconductor device wafers for additional functions, features, and improved performance in accordance with the teachings of the present invention.

Figure 2:
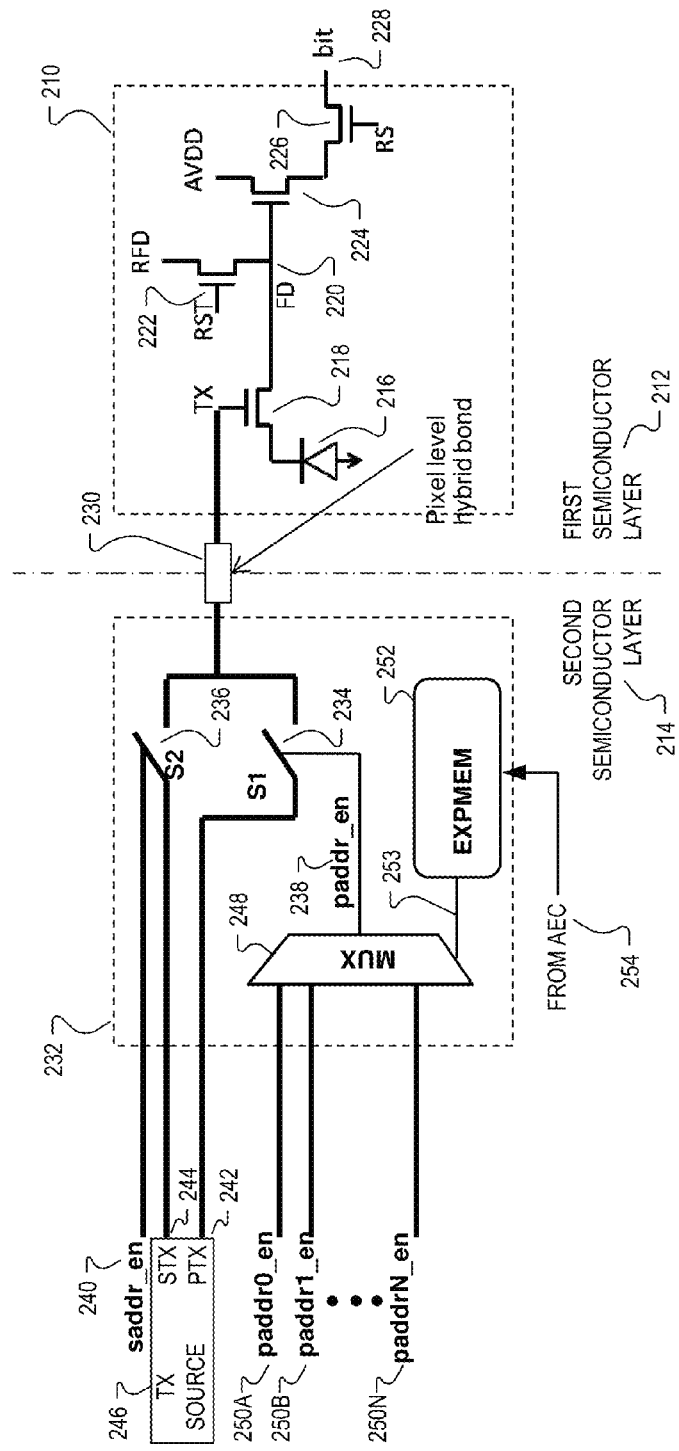
FIG. 2 is a circuit diagram showing an example of a portion of the circuitry of a pixel circuit including a high dynamic range read out architecture using in-frame multi-bit exposure in accordance with the teachings of the present invention.

FIG. 2 is a circuit diagram showing an example of a portion of the circuitry of a pixel circuit 210 including a high dynamic range read out architecture using in-frame multi-bit exposure coupled to a select circuit 232 in accordance with the teachings of the present invention. It is noted that pixel circuit 210 may be an example of one of the pixel circuits 110A, 110B, 110C of pixel array 106 of FIG. 1, and that similarly named and numbered elements referenced below are coupled and function similar to as described above. As shown in the depicted example, pixel circuit 210 is disposed in a first semiconductor layer 212. Pixel circuit 210 includes a photodiode 216 disposed in a first semiconductor layer 212 adapted to accumulate image charge in response to incident light. A transfer transistor 218 disposed in the first semiconductor layer 212 is coupled between the photodiode 216 and a floating diffusion 220 disposed in the first semiconductor layer 212 to selectively transfer the image charge accumulated in the photodiode 216 to the floating diffusion 220.

Continuing with the illustrated example, a reset transistor 222 is disposed in the first semiconductor layer 212 and coupled to the floating diffusion 220 to selectively reset the floating diffusion 220 in response to a reset RST signal. In the example, the reset transistor is coupled between a reset floating diffusion RFD voltage and the floating diffusion 220. An amplifier transistor 224 is disposed in the first semiconductor layer 212 and includes an amplifier gate terminal coupled to the floating diffusion 220. In the example, the amplifier transistor 224 is a source-follower coupled transistor, and has a drain terminal coupled to an AVDD voltage and a source terminal coupled to provide the amplified output of amplifier transistor 224. A row select transistor 226 is disposed in the first semiconductor layer 212 and is coupled between a bitline 228 and the amplifier transistor 224. In operation, the row select transistor 226 is coupled to output the image data of pixel circuit 210 in response to a row select signal RS.

A select circuit 232 is disposed in a second semiconductor layer 214 and is coupled to a control terminal of the transfer transistor 218 through a pixel level hybrid bond 230 between the first semiconductor layer 212 and second semiconductor layer 214 to select between a first transfer control signal PTX 242 and a second transfer control signal STX 244 to control the transfer transistor 218 in accordance with the teachings of the present invention. As will be discussed in further detail below, the select circuit 232 may be one of a plurality of select circuits that coupled to corresponding pixel circuits 210 of a pixel array in accordance with the teachings of the present invention. In the example depicted in FIG. 2, select circuit 232 is coupled to output the first transfer control signal PTX 242 in response to a precharge enable signal paddr_en 238 during a read out operation of a different row than a row of the pixel array in which the transfer transistor 218 is included. The select circuit 232 is also coupled to output the second transfer control signal STX 244 in response to a sample enable signal saddr_en 240 during a read out operation of a pixel circuit in the same row of the pixel array in which the transfer transistor 218 is included. Accordingly, the first transfer control signal PTX 242 can be used to independently precharge the pixel circuit 210 to control the exposure of pixel circuit 210, while a different row is of the pixel array is being read out with the second transfer control signal STX 244 in accordance with the teachings of the present invention. Therefore, individual in-frame exposure control for each individual pixel circuit 210 is realized, which leads to improved charge integration across the entire pixel array to provide high dynamic range image sensing in accordance with the teachings of the present invention.

As shown in the example depicted in FIG. 2, select circuit 232 includes a first switch S1 234 coupled to generate the first transfer control signal PTX 242 in response to the precharge enable signal paddr_en 238, and a second switch S2 236 coupled to generate the second transfer control signal STX 244 in response to the sample enable signal saddr_en 240. A multiplexor circuit 248 is coupled to generate the precharge enable signal paddr_en 238 in response to a selection of one of a plurality of precharge row signals, illustrated in FIG. 2 as paddr0_en 250A, paddr1_en 250B, . . . , paddrN_en 250N, in response to an exposure value signal 253, which is stored in an exposure memory EXPMEM 252. In one example, the exposure value represented by exposure value signal 253 stored in exposure memory EXPMEM 252 is a multi-bit (e.g., 4-bit) value received from an automatic exposure control (AEC) circuit 254. As will be discussed in greater detail below, in one example, the exposure value stored in exposure memory EXPMEM 252 is used to adjust the exposure of the image data generated by pixel circuit 210. In another example, the exposure value stored in exposure memory EXPMEM 252 may be shared by a block of pixels to adjust the exposure of the image data generated by the block of pixels in a pixel array including pixel circuit 210, such as for example an 8×8 block of neighboring pixels.

The example depicted in FIG. 2 also illustrates that a single TX source 246 is used to generate the first transfer control signal PTX 242 the second transfer control signal STX 244. Therefore, in an example in which the pixel array is read out with a rolling shutter, and in which there are only 11 possible rows of a pixel array that can be precharged at a time (i.e., N=10 for paddr0_en 250A, paddr1_en 250B, . . . , paddrN_en 250N), plus the one row that is being read out at a time, there can only be a maximum load of only 12 possible rows of the pixel array that can be loaded on the first transfer control signal PTX 242 the second transfer control signal STX 244 at any one time. In other words, in the example with N=10, for each row that is being read out with the rolling shutter, there can only be 11 other enabled rows in the pixel array that can be precharged at a time. All other rows in the pixel array are ignored for that specific row that is being read out at the time. It is therefore appreciated of course that this maximum load on the single TX source 246 of only 12 rows is significantly less than an example in which every row of the entire pixel array could to be driven by the single TX source 246 at a time.

Stated in another way, the first transfer control signal PTX 242 is generated based on precharge address, so at each time, only N+1 rows receive the first transfer control signal PTX 242. The total loading of TX source is therefore only N+2 rows, instead of an entire pixel array of the order of $2^N$ rows. Thus, it is appreciated that the total number of rows of a pixel array including pixel circuit 210 that can be precharged and therefore receive the first transfer control signal PTX 242 at a time is equal to a total number of different possible exposure values that can be stored by the exposure memory EXPMEM, which is significantly less than the total number of rows in the pixel array. Thus, the single TX source 246 is used to generate the first transfer control signal PTX 242 the second transfer control signal STX 244 has significantly less load requirements than a TX source that was required to provide the transfer control signals to every row in a pixel array.

Figure 3:
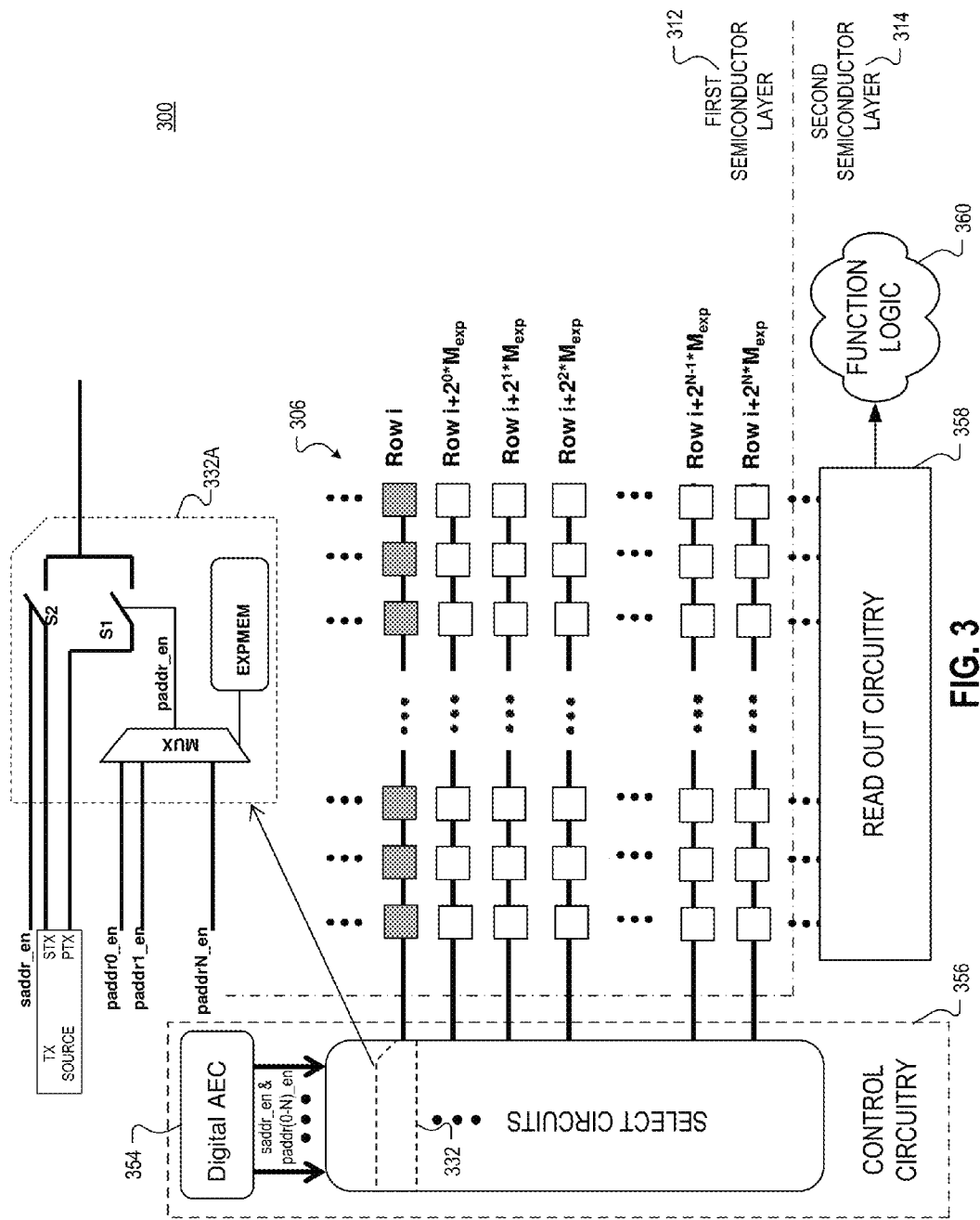
FIG. 3 is a block diagram illustrating an example imaging system including a pixel array of pixel circuits having a high dynamic range read out architecture using in-frame multi-bit exposure in accordance with the teachings of the present invention.

FIG. 3 is a block diagram illustrating an example imaging system 300 including a pixel array 306 of pixel circuits having a high dynamic range read out architecture using in-frame multi-bit exposure in accordance with the teachings of the present invention. In the illustrated example, it is appreciated that each of the pixel circuits included in pixel array 306 of FIG. 3 may be examples of the pixel circuits 110A, 110B, 110C of pixel array 106 of FIG. 1, or of pixel circuit 210 of FIG. 2, and that similarly named and numbered elements referenced below are coupled and function similar to as described above. As shown in the example depicted in FIG. 3, control circuitry 356 is coupled to the pixel array 306 to control the operation of the pixel array 306 including independently controlling an exposure time for each one of the pixel circuits in the pixel array 306 for a single frame in accordance with the teachings of the present invention. In the example, read out circuitry 358 is coupled to the pixel array 306 to read out image data from the plurality of pixel circuits of pixel array 306. In one example, the image data that is read out by read out circuitry 358 is transferred to function logic 360.

In the depicted example, the pixel circuits of pixel array 306 are disposed in a first semiconductor layer 312, and the control circuitry 356, read out circuitry 358, and function logic 360 are disposed in second semiconductor layer 314. In the example, the first and second semiconductor layers 312 and 314 are stacked and coupled together in a stacked chip scheme. In one example, the select circuits 332 are coupled to each pixel circuit of pixel array 306 through pixel level hybrid bonds (see, e.g., pixel level hybrid bond 230 in FIG. 2).

In one example, read out circuitry 358 may include amplification circuitry, analog-to-digital (ADC) conversion circuitry or otherwise. Function logic 360 may simply store the image data or even manipulate the image data by applying post image effects (e.g., crop, rotate, remove red eye, adjust brightness, adjust contrast or otherwise). Pixel array 306 may be implemented as a front side illuminated image sensor or a back side illuminated image sensor. As illustrated, each pixel circuit is arranged into rows and columns in pixel array 306 to acquire image data of a person, place or object, which can then be used to render an image of the person, place or object.

As shown in the depicted example, the control circuitry 356 includes a digital automatic exposure control (AEC) 354 coupled to select circuits 332. In one example, it is appreciated that AEC 354 may also include row decoder elements to provide the sample address and precharge address enable signals (e.g., saddr_en and paddr(0-N)_en). As can be appreciated in the detailed version of select circuit 332A illustrated in FIG. 3, the select circuits 332 may be examples of the select circuit 232 illustrated in FIG. 2. Accordingly, similarly named and numbered elements referenced below are coupled and function similar to as described above. In the depicted example, the AEC 354 is coupled to generate the exposure values stored in the exposure memory EXPMEM of the select circuits 310. In addition, the AEC 354 is also coupled to generate the sample address enable signals (e.g., saddr_en) as well as the precharge address enable signals (e.g., paddr(0-N)_en) that are coupled to be received by the select circuits 332.

In one example, AEC 354 is coupled to read the image data from read out circuitry 358 to determine, based on the image data values of pixel circuits from a previous frame, any individual pixel circuits in pixel array 306 that may benefit from precharging, and therefore additional exposure time, in a subsequent frame to provide HDR imaging in accordance with the teachings of the present invention. As such, AEC 354 is coupled to provide the corresponding exposure values for the exposure memories EXPMEM in the select circuits 332 as well as the corresponding sample address enable signals saddr_en and precharge address enable signals paddr(0-N)_en in accordance with the teachings of the present invention.

As mentioned, control circuitry 356 also includes corresponding row decoder circuitry coupled to AEC 354 to control the switches S1 and S2 in the select circuits of each pixel circuit to provide the first and second transfer control signals PTX and STX to the transfer transistors that are included in the row of pixel circuits the pixel array 306 in accordance with the teachings of the present invention.

In a rolling shutter design example of operation, assume that Row i of pixel array 306 is being read out. As such, the transfer transistors in the pixel circuits of Row i are coupled to receive the STX transfer control signal when the transfer transistors are activated during the read out operation while Row i is read out. In the depicted example, Rows $i+2^{(0-N)}*M_{exp}$ may be coupled to be precharged, where N is an integer greater than or equal to zero, and $M_{exp}$ is an exposure factor. Thus, assuming for example that N=10 and the exposure factor of $M_{exp}$=1, the N+1, or 11 other rows of the pixel array 306 that may be precharged and receive the PTX transfer control signal to provide additional exposure time for high dynamic range imaging are: Row $i+2^0*M_{exp}$, Row $i+2^1*M_{exp}$, Row $i+2^2*M_{exp}$, ..., Row $i+2^9*M_{exp}$, and Row $i+2^{10}*M_{exp}$ in accordance with the teachings of the present invention. In other words, if the row of the pixel array 306 that is being read out is Row i, the other rows of pixel array 306 that may be precharged while Row i is being read out with N=10, and exposure factor $M_{exp}$=1, are Rows i+1, i+2, i+4, ..., i+512, and i+1024. The other rows of pixel array 306 are neither read out nor precharged at this time in accordance with the teachings of the present invention.

Figure 4:
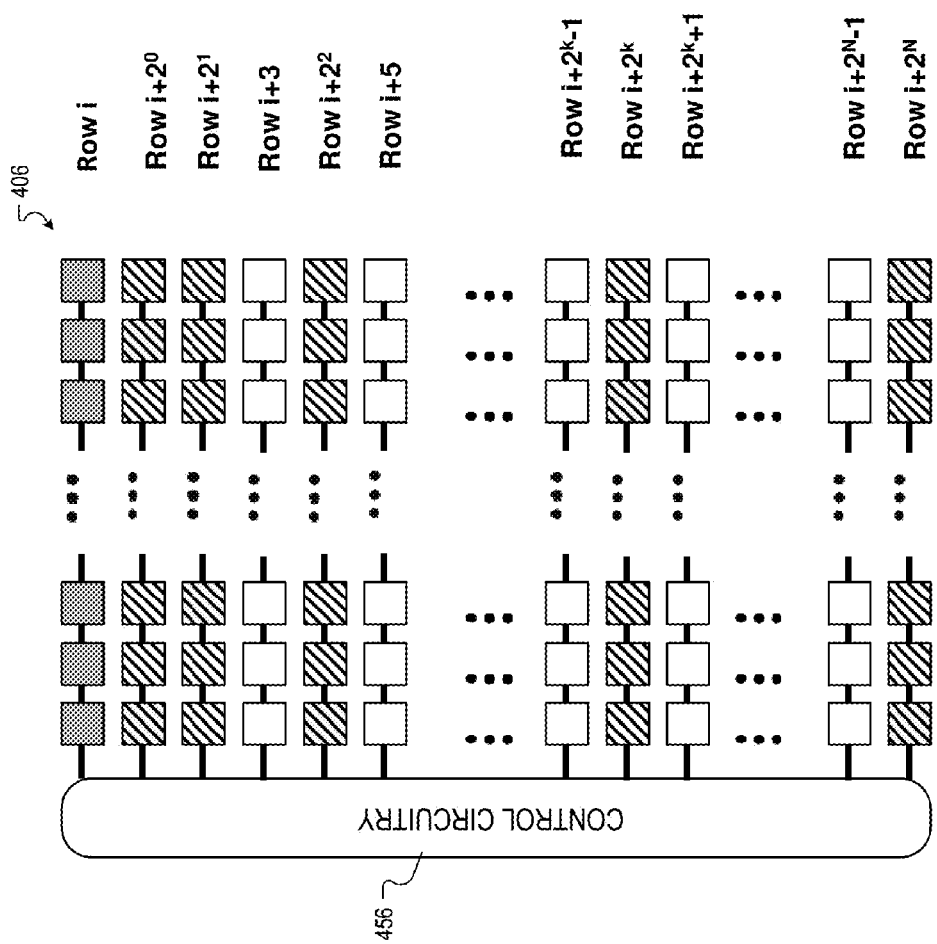
FIG. 4 is a block diagram illustrating the rows that are read out, that are precharged, and that are not precharged in an example imaging system in accordance with the teachings of the present invention.

To better illustrate, FIG. 4 is a block diagram showing an example of a pixel array 406 in which a row is read out, some rows are precharged, and other rows are not read out or precharged in an example imaging system in accordance with the teachings of the present invention. It is appreciated that pixel array 406 of FIG. 4 may be an example of pixel array 106 of FIG. 1, or of pixel circuit 306 of FIG. 3, and that similarly named and numbered elements referenced below are coupled and function similar to as described above.

In the example depicted in FIG. 4, it is assumed that control circuitry 456 is coupled to control pixel array 406 with a rolling shutter design of operation with Row i of pixel array 406 is being read out in the illustrated example. As such, the transfer transistors included in the pixel circuits of Row i are coupled to receive the STX transfer control signal when the transfer transistors are activated during the read out operation of Row i. In the depicted example, the exposure factor is $M_{exp}$=1. As such, the next row, Row $i+2^0$, or Row i+1, is precharged as is indicated with the crosshatching in Row i+1. Accordingly, the transfer transistors included in the pixel circuits of Row i+1 are coupled to receive the precharge PTX transfer control signal if the transfer transistors are to be activated to be precharged during the read out operation of Row i. Similarly, the next row that is precharged is Row $i+2^1$, or Row i+2, as is indicated with the crosshatching in Row i+2. As such, the transfer transistors included in the pixel circuits of Row i+2 are coupled to receive the precharge PTX transfer control signal if the transfer transistors are to be activated to be precharged during the read out operation of Row i.

However, the next row, Row i+3, is neither read out nor precharged as is indicated with the lack of crosshatching in Row i+3. As such, the transfer transistors included in the pixel circuits of Row i+3 are neither coupled to receive the precharge PTX transfer control signal nor the read out sample STX transfer control signal during the read out operation of Row 1.

Instead, the next row that is precharged is Row $i+2^2$, or Row i+4, as is indicated with the crosshatching in Row i+4. As such, the transfer transistors included in the pixel circuits of Row i+4 are coupled to receive the precharge PTX transfer control signal if the transfer transistors are to be activated to be precharged during the read out operation of Row i.

However, the next row, Row i+5, is neither read out nor precharged as is indicated with the lack of crosshatching in Row i+5. As such, the transfer transistors included in the pixel circuits of Row i+5 are neither coupled to receive the precharge PTX transfer control signal nor the read out sample STX transfer control signal during the read out operation of Row 1.

As shown in the example depicted in FIG. 4, the rows $i+2^K-1$, $i+2^K$, and $i+2^K+1$ are coupled and function similarly as rows i+3, i+4, and i+5. In the depicted example, the furthest row from Row i to be coupled to be precharged is Row $i+2^N$, while the row $i+2^{N-1}$ is not coupled to be precharged. Thus, in an example in which the exposure factor is $M_{exp}$=1 and N=10, the furthest row from Row i to be coupled to be precharged is Row $i+2^{10}$, or Row i+1024.

Figure 5:
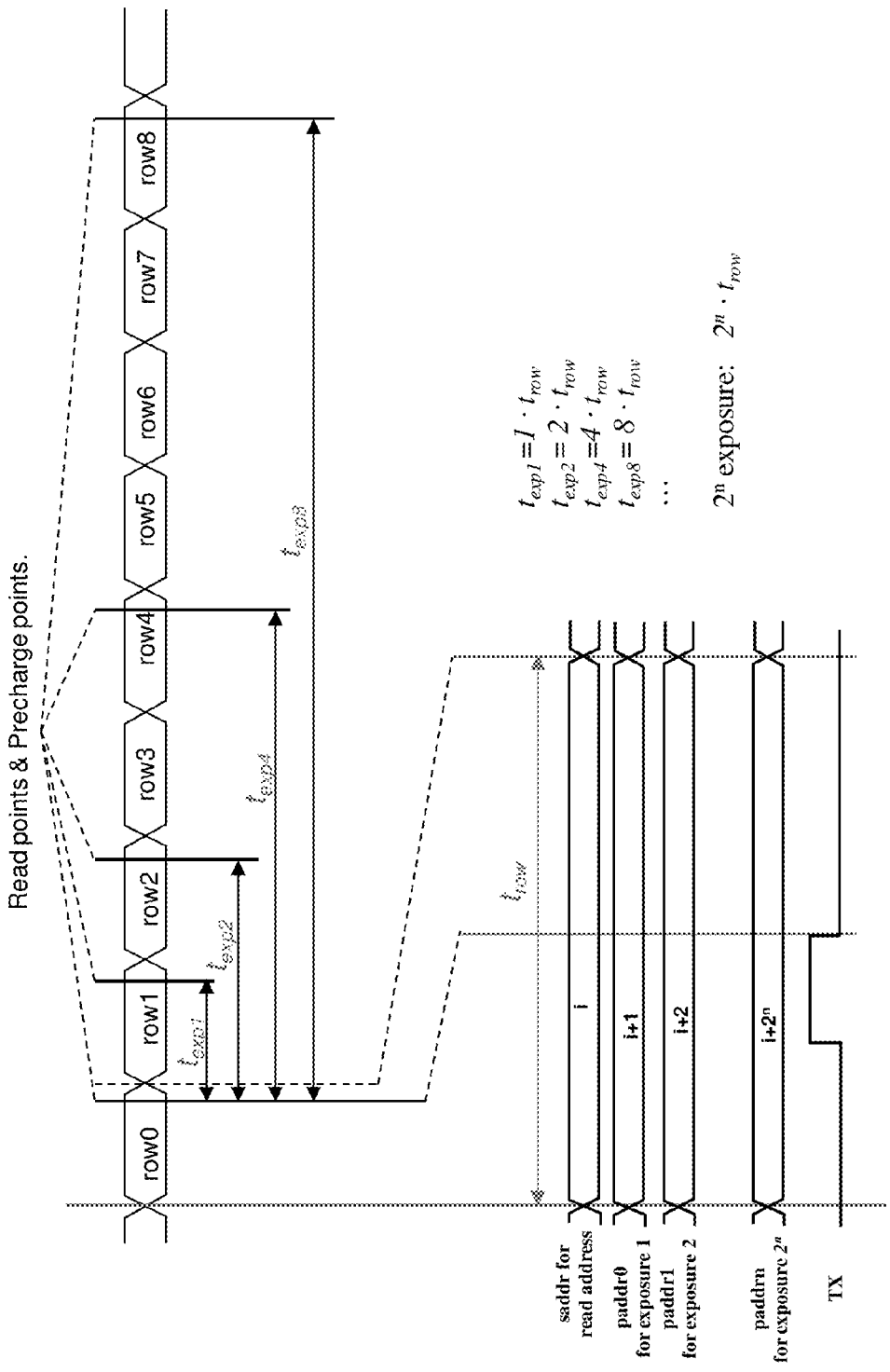
FIG. 5 is a timing diagram illustrating example signals of an example imaging system including a pixel array of pixel circuits having a high dynamic range read out architecture using in-frame multi-bit exposure in accordance with the teachings of the present invention.

FIG. 5 is a timing diagram illustrating example signals of an example imaging system including a pixel array of pixel circuits having a high dynamic range read out architecture using in-frame multi-bit exposure, such as the above-described examples, in accordance with the teachings of the present invention. It should be appreciated that the timing diagram illustrated in FIG. 5 is a simplified timing diagram for explanation purposes in that the precharge exposure times described below are substantial estimates of actual precharge exposure times because during the actual row timing, there are also N+1 transfer transistor control pulses for precharges/resets, as well as the transfer transistor control pulse for read out. Accordingly, the actual precharge exposure times for each of the exposure steps may have different offsets, which may also affect exposure times. As such, the actual precharge exposure times are not necessarily exact powers of 2 multiples of the row timing. However, the example below is simplified for explanation purposes so as not to obscure the teachings in accordance with the teachings of the present invention.

Thus, continuing with the depicted example, it will be assumed that the time to read out a row is $t_{row}$. As such, the time that the sample address enable signal saddr is enabled for the row "i" that is being read out (i.e., "saddr for read address") is equal to $t_{row}$. The depicted example also illustrates that the transfer control signal TX is therefore triggered during the read out "row0" of row "i" as shown in FIG. 5. In addition, the example depicted in FIG. 5 also illustrates that the other rows of the pixel array that may be precharged an additional exposure time during the read out of row i are: paddr0, paddr1, ..., paddrn, which correspond to i+1, i+1 (i.e., $i+2^0$), i+2 (i.e., $i+2^1$), ..., and $i+2^N$.

As shown in the depicted example, the first row to be precharged is i+1 (i.e., i+20), which as shown with respect to row1 is precharged an additional exposure time $t_{exp1}$, which equal $1*t_{row}$. The next row to be precharged is i+2 (i.e., $i+2^1$), which as shown with respect to row2 is precharged an additional exposure time $t_{exp2}$, which equal $2*t_{row}$. The next row to be precharged is i+4 (i.e., $i+2^2$), which as shown with respect to row4 is precharged an additional exposure time $t_{exp4}$, which equal $4*t_{row}$. Similarly, the next row to be precharged is i+8 (i.e., $i+2^3$), which as shown with respect to row8 is precharged an additional exposure time $t_{exp8}$, which equal $8*t_{row}$. It is appreciated that this pattern of precharge exposure times continues until the last row $i+2^N$ is precharged an additional exposure time $t_{expn}$, which equal $2_n*t_{row}$.

It is therefore appreciated that the additional precharge exposure times $t_{exp1}$, $t_{exp2}$, ..., $t_{expn}$ can be programmed from $2^0 * t_{row}$ to $2^n * t_{row}$, where $t_{row}$ is the read out time of single row $t_{row}$. Assuming that n is an integer from 1 to 10, which corresponds to a 4-bit binary control, a total of n+1 (i.e., 11) precharge exposure steps are provided to enable high dynamic range image sensing in accordance with the teachings of the present invention. Accordingly, this leads to 10-bit dynamic range in exposure time. Combined for example with a column level 14-bit analog to digital converter (ADC), such a read out architecture can achieve a total of 24-bit dynamic range in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel circuit, comprising:
   a photodiode disposed in a first semiconductor layer adapted to accumulate image charge in response to incident light;
   a transfer transistor disposed in the first semiconductor layer coupled between the photodiode and a floating diffusion disposed in the first semiconductor layer to selectively transfer the image charge accumulated in the photodiode to the floating diffusion; and
   a select circuit disposed in a second semiconductor layer coupled to a control terminal of the transfer transistor through a hybrid bond between the first and second semiconductor layers to select between first and second transfer control signals to control the transfer transistor, wherein the select circuit is coupled to output the first transfer control signal in response to a precharge enable signal during a read out operation of a different row than a row in which the transfer transistor is included, and wherein the select circuit is coupled to output the second transfer control signal in response to a sample enable signal during a read out operation of the row in which the transfer transistor is included,
   wherein the pixel circuit is one of a plurality of pixel circuits included in a pixel array arranged into a plurality of rows and a plurality of columns, and
   wherein a total number of rows of the pixel array that can receive the first or second transfer control signal at a time is less than a total number of rows of the pixel array.

2. The pixel circuit of claim 1, wherein the select circuit includes:
   a first switch coupled to generate the first transfer control signal in response to the precharge enable signal;
   a second switch coupled to generate the second transfer control signal in response to the sample enable signal;
   a multiplexor circuit coupled to generate the precharge enable signal in response to a selection of one of a plurality of precharge row signals in response to an exposure value signal; and
   an exposure memory coupled to store the exposure value signal.

3. The pixel circuit of claim 2, wherein the pixel circuit is one of a block of pixel circuits of a pixel array, wherein the exposure value signal stored in the exposure memory is shared by the pixel circuits in the block of pixel circuits.

4. The pixel circuit of claim 2, wherein a total number of rows of the pixel array that can receive the first transfer control signal at a time is equal to a total number of different possible exposure values that can be stored by the exposure memory.

5. The pixel circuit of claim 4, further comprising an automatic exposure control circuit disposed in the second semiconductor layer and coupled to generate the different possible exposure values stored by the exposure memory.

6. The pixel circuit of claim 1, further comprising a transfer control signal source disposed in the second semiconductor layer and coupled to generate the first and second transfer control signals coupled to be received by the pixel array at the same time, wherein a maximum load at a time of the transfer control signal source is the total number of rows of the pixel array that can receive the first transfer control signal at the time for the first transfer control signal, and a single row of the pixel array that is being read out at the time for the second transfer control signal.

7. The pixel circuit of claim 1, wherein the first control signal is a precharge transfer control signal, and wherein second control signal is a sample transfer control signal.

8. The pixel circuit of claim 1, further comprising:
   a reset transistor disposed in the first semiconductor layer and coupled to the floating diffusion to selectively reset the floating diffusion;
   an amplifier transistor disposed in the first semiconductor layer and having an amplifier gate coupled to the floating diffusion; and
   a row select transistor disposed in the first semiconductor layer coupled between a bitline and the amplifier transistor.

9. The pixel circuit of claim 1, wherein the first and second semiconductor layers are stacked and coupled together in a stacked chip scheme.

10. An imaging system, comprising:
    a pixel array having a plurality of pixel circuits arranged into a plurality of rows and a plurality of columns, wherein each one of the pixel circuits includes:
        a photodiode disposed in a first semiconductor layer adapted to accumulate image charge in response to incident light;
        a transfer transistor disposed in the first semiconductor layer coupled between the photodiode and a floating diffusion disposed in the first semiconductor layer to selectively transfer the image charge accumulated in the photodiode to the floating diffusion;
        a select circuit disposed in a second semiconductor layer coupled to a control terminal of the transfer transistor through a hybrid bond between the first and second semiconductor layers to select between a first and second transfer control signals to control the transfer transistor, wherein the select circuit is coupled to output the second transfer control signal in response to a precharge enable signal during a read out operation of a different row than a row in which the transfer transistor is included, and wherein the select circuit is coupled to output the second transfer control signal in response to a sample enable signal during a read out operation of the row in which the transfer transistor is included;

control circuitry disposed in the second semiconductor layer and coupled to the pixel array to control operation of the pixel array, wherein the select circuit is included in the control circuitry; and read out circuitry disposed in the second semiconductor layer and coupled to the pixel array to read out image data from the plurality of pixel circuits, wherein a total number of rows of the pixel array that can receive the first or second transfer control signal at a time is less than a total number of rows of the pixel array.

11. The imaging system of claim 10, further comprising function logic disposed in the second semiconductor layer and coupled to the read out circuitry to store the image data read out from the plurality of pixel circuits.

12. The imaging system of claim 10, wherein the select circuit includes:

a first switch coupled to generate the first transfer control signal in response to the precharge enable signal;

a second switch coupled to generate the second transfer control signal in response to the sample enable signal;

a multiplexor circuit coupled to generate the precharge enable signal in response to a selection of one of a plurality of precharge row signals in response to an exposure value signal; and an exposure memory coupled to store the exposure value signal.

13. The imaging system of claim 12, wherein the pixel circuit is one of a block of pixel circuits of the pixel array, wherein the exposure value signal stored in the exposure memory is shared by the pixel circuits in the block of pixel circuits.

14. The imaging system of claim 11, wherein a total number of rows of the pixel array that can receive the first transfer control signal at a time is equal to a total number of different possible exposure values that can be stored by the exposure memory.

15. The imaging system of claim 14, further comprising an automatic exposure control circuit disposed in the second semiconductor layer and coupled to generate the different possible exposure values stored by the exposure memory.

16. The imaging system of claim 10, further comprising a transfer control signal source disposed in the second semiconductor layer and coupled to generate the first and second transfer control signals coupled to be received by the pixel array at the same time, wherein a maximum load at a time of the transfer control signal source is the total number of rows of the pixel array that can receive the first transfer control signal at the time for the first transfer control signal, and a single row of the pixel array that is being read out at the time for the second transfer control signal.

17. The imaging system of claim 10, wherein the first control signal is a precharge transfer control signal, and wherein second control signal is a sample transfer control signal.

18. The imaging system of claim 10, wherein each one of the pixel circuits further includes:

a reset transistor disposed in the first semiconductor layer and coupled to the floating diffusion to selectively reset the floating diffusion;

an amplifier transistor disposed in the first semiconductor layer and having an amplifier gate coupled to the floating diffusion; and a row select transistor disposed in the first semiconductor layer coupled between a bitline and the amplifier transistor.

19. The imaging system of claim 10, wherein the first and second semiconductor layers are stacked and coupled together in a stacked chip scheme.

\* \* \* \* \*